US008829337B1

(12) United States Patent
Dutta (10) Patent No.: US 8,829,337 B1
(45) Date of Patent: Sep. 9, 2014

(54) PHOTOVOLTAIC CELLS BASED ON NANO OR MICRO-SCALE STRUCTURES (71) Applicant: Banpil Photonics, Inc., Santa Clara, CA (US)

(72) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 13/647,192

(22) Filed: Oct. 8, 2012

Related U.S. Application Data

(62) Division of application No. 11/555,411, filed on Nov. 1, 2006, now Pat. No. 8,314,327.

(60) Provisional application No. 60/597,040, filed on Nov. 6, 2005.

(51) Int. Cl.
*H01L 31/068* (2012.01)
*H01L 31/0236* (2006.01)
*H01L 31/18* (2006.01)

(52) U.S. Cl.
CPC ............ *H01L 31/0236* (2013.01); *H01L 31/18* (2013.01)
USPC ........... 136/256; 136/255; 136/252; 136/260; 136/262; 257/53; 257/81; 257/94; 257/95; 257/101; 257/102; 257/103; 257/E31.032; 257/E31.039; 257/E31.04; 438/57; 438/63; 438/86; 438/94; 438/95; 438/98

(58) Field of Classification Search
USPC ............ 136/256, 255, 252, 260, 262; 257/53, 257/81, 94, 95, 101, 102, 103, E31.032, 257/E31.039, E31.04; 438/57, 63, 86, 94, 438/95, 98
See application file for complete search history.

(56) References Cited

U.S. PATENT DOCUMENTS

| | | | | |
|---|---|---|---|---|
| 3,978,333 A * | 8/1976 | Crisman et al. | ............... | 136/255 |
| 4,094,704 A * | 6/1978 | Milnes | ............... | 136/244 |
| 4,140,591 A * | 2/1979 | Fong et al. | ............... | 205/112 |
| 4,295,002 A * | 10/1981 | Chappell et al. | ............... | 136/244 |
| 4,320,247 A * | 3/1982 | Gatos et al. | ............... | 136/255 |
| 4,461,922 A * | 7/1984 | Gay et al. | ............... | 136/249 |
| 4,477,721 A * | 10/1984 | Chappell et al. | ............... | 257/82 |
| 4,784,701 A * | 11/1988 | Sakai et al. | ............... | 136/249 |
| 5,264,048 A * | 11/1993 | Yoshikawa et al. | ............... | 136/263 |
| 6,033,928 A * | 3/2000 | Eriguchi et al. | ............... | 438/42 |
| 6,852,920 B2 * | 2/2005 | Sager et al. | ............... | 136/263 |
| 6,878,871 B2 * | 4/2005 | Scher et al. | ............... | 136/252 |
| 7,341,774 B2 * | 3/2008 | Kalkan et al. | ............... | 428/119 |
| 7,834,264 B2 * | 11/2010 | Majumdar et al. | ............... | 136/230 |
| 2002/0130311 A1 * | 9/2002 | Lieber et al. | ............... | 257/1 |
| 2002/0172820 A1 * | 11/2002 | Majumdar et al. | ............... | 428/357 |
| 2002/0189666 A1 * | 12/2002 | Forrest et al. | ............... | 136/263 |
| 2002/0192441 A1 * | 12/2002 | Kalkan et al. | ............... | 428/209 |
| 2003/0013280 A1 * | 1/2003 | Yamanaka | ............... | 438/487 |
| 2003/0089899 A1 * | 5/2003 | Lieber et al. | ............... | 257/9 |
| 2003/0168964 A1 * | 9/2003 | Chen | ............... | 313/495 |
| 2004/0003839 A1 * | 1/2004 | Curtin | ............... | 136/250 |

(Continued)

*Primary Examiner* — Golam Mowla (57) ABSTRACT

Novel structures of photovoltaic cells (also treated as solar cells) are provided. The cells are based on nanometer-scaled wires, tubes, and/or rods, which are made of electronic materials covering semiconductors, insulators or metallic in structure. These photovoltaic cells have large power generation capability per unit physical area over the conventional cells. These cells will have enormous applications in space, commercial, residential, and industrial applications.

20 Claims, 8 Drawing Sheets

(56) References Cited

U.S. PATENT DOCUMENTS

| | | | |
|---|---|---|---|
| 2004/0084080 A1* | 5/2004 | Sager et al. | 136/263 |
| 2004/0109666 A1* | 6/2004 | Kim, II | 385/147 |
| 2004/0118448 A1* | 6/2004 | Scher et al. | 136/252 |
| 2004/0213727 A1* | 10/2004 | Mauro | 423/447.1 |
| 2005/0045874 A1* | 3/2005 | Xiao et al. | 257/40 |
| 2005/0056312 A1* | 3/2005 | Young et al. | 136/258 |
| 2005/0126628 A1* | 6/2005 | Scher et al. | 136/263 |
| 2005/0214967 A1* | 9/2005 | Scher et al. | 438/63 |
| 2006/0032530 A1* | 2/2006 | Afzali-Ardakani et al. | 136/263 |
| 2006/0207647 A1* | 9/2006 | Tsakalakos et al. | 136/256 |
| 2007/0012354 A1* | 1/2007 | Kobayashi et al. | 136/252 |
| 2007/0175507 A1* | 8/2007 | Dutta | 136/255 |
| 2007/0204901 A1* | 9/2007 | Dutta | 136/256 |
| 2007/0204902 A1* | 9/2007 | Dutta | 136/256 |
| 2009/0050204 A1* | 2/2009 | Habib | 136/261 |
| 2009/0266418 A1* | 10/2009 | Hu et al. | 136/260 |
| 2010/0012190 A1* | 1/2010 | Goto et al. | 136/261 |
| 2010/0212728 A1* | 8/2010 | Hori et al. | 136/255 |

* cited by examiner

PHOTOVOLTAIC CELLS BASED ON NANO OR MICRO-SCALE STRUCTURES

PARENT CASE TEXT

This is a divisional of application Ser. No. 11/555,411 filed on Nov. 1, 2006.

CROSS REFERENCE TO RELATED APPLICATIONS

This application claims the benefit of U.S. Provisional Application No. 60/597,040 filed Nov. 6, 2005.

FIELD OF INVENTIONS

This patent specification relates to structures of photovoltaic cells (also solar cells). More specifically, it relates to structures of photovoltaic cells comprising numerous nanometer-scale wires, rods and/or tubes to increase the junction area for increasing power generation capability per unit area. This also relates to photovoltaic cells comprising with nano or micro scaled-blocks. These photovoltaic cells can be used in commercial, residential, and also industrial applications for power generation.

BACKGROUND OF THE INVENTIONS

Photovoltaic cells where light is converted into electric power and fed to external loads, which are electrically connected to the photovoltaic cells, have been prevailing in a wide range of applications such as consumer electronics, industrial electronics, and space exploration. In consumer electronics, photovoltaic cells that consist of materials such as amorphous silicon are used for a variety of inexpensive and low power applications. Typical conversion efficiency, i.e. the solar cell conversion efficiency, of amorphous silicon based photovoltaic cells is in the range of ~10% [Yamamoto K, Yoshimi M, Suzuki T, Tawada Y, Okamoto T, Nakajima A. Thin film poly-Si solar cell on glass substrate fabricated at low temperature. Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as residential and industrial solar power generation systems, either poly-crystalline or single-crystalline silicon is typically used because there are more stringent requirements for better reliability and higher efficiency than the applications in consumer electronics. Photovoltaic cells consisting of poly-crystalline and single-crystalline silicon generally offer conversion efficiencies in the range of ~20% and ~25% [Zhao J, Wang A, Green M, Ferrazza F. Novel 19.8% efficient 'honeycomb' textured multicrystalline and 24.4% monocystalline silicon solar cell. Applied Physics Letters 1998; 73: 1997-1993.] respectively. As many concerns associated with a steep increase in the amount of the worldwide energy consumption are raised, further development in industrial solar power generation systems has been recognized as a main focus for an alternative energy source.

Group II-VI compound semiconductors, for example CdTe and CdS, have been considered for the purpose of creating industrial solar power generation systems, manufactured at a lower cost and moderate conversion efficiency. This approach resulted in a comparable conversion efficiency of ~17% [Wu X, Keane J C, Dhere R G, DeHart C, Duda A, Gessert T A, Asher S, Levi D H, Sheldon P. 16.5%-efficient CdS/CdTe polycrystalline thin-film solar cell. Proceedings of the 17th European Photovoltaic Solar Energy Conference, Munich, 22-26 Oct. 2001; 995-1000.]. This conversion efficiency is comparable to those for the single crystalline silicon photovoltaic devises; however, the toxic nature of these materials is of great concern for environment.

Group I-III-VI compound semiconductors, such as $CuInGaSe_2$, have been extensively investigated for industrial solar power generation systems. This material can potentially be synthesized at a much lower cost than its counterpart, single crystalline silicon. However, a conversion efficiency of ~19%, which is comparable to that of single crystalline silicon based cells, can be obtained, thus far, only by combining with the group II-VI compound semiconductor cells [Contreras M A, Egaas B, Ramanathan K, Hiltner J, Swartzlander A, Hasoon F, Noufi R. Progress toward 20% efficiency in Cu(In,Ga)Se polycrystalline thin-film solar cell. Progress in Photovoltaics: Research and Applications 7999; 7: 311-316.], which again raises issues associated with the toxic nature of these materials.

Photovoltaic cells designed for several exclusive applications, where the main focus is high conversion efficiency, generally consist of group III-V semiconductors, including GaInP and GaAs. In general, synthesis processes of single crystalline group III-V are very costly because of substantial complications involved in epitaxial growth of group III-V single crystalline compound semiconductors. Typical conversion efficiencies of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey G S, Cotal H L, Ermer J H, Sherif R A, Karam N H. Lattice-matched and metamorphic GaInP/GaInAs/Ge concentrator solar cells. Proceedings of the World Conference on Photovoltaic Energy Conversion (WCPEC-3), Osaka, May 2003; to be published.].

Figures 1A, 1B:
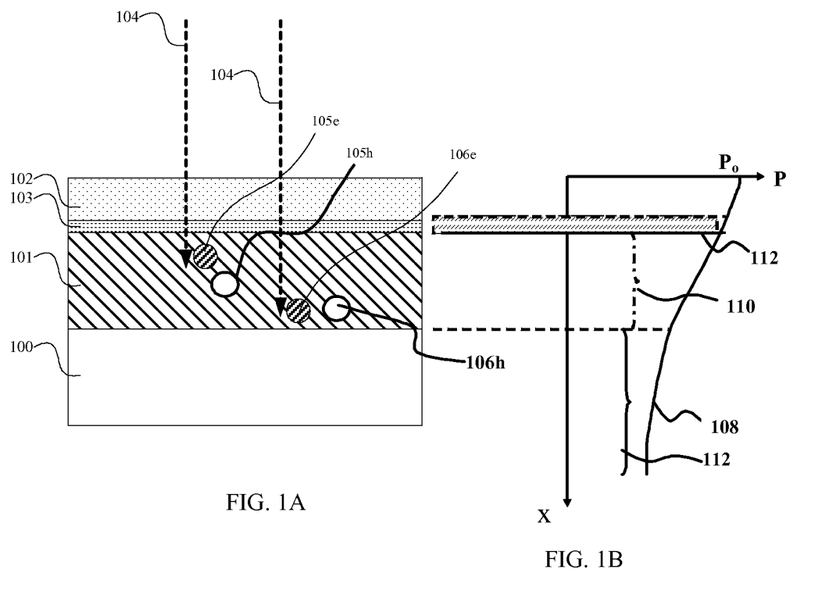
FIG. 1A shows the cross-sectional view of a conventional photovoltaic cell structure.
FIG. 1B is the explanatory diagram representing today's photovoltaic cell and the light intensity behavior inside semiconductor materials.

All photovoltaic cells in the prior art described above, regardless of what materials the cell is made from, essentially fall into one specific type of structure, described in FIG. 1A. Shown in FIG. 1A is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generate electron-hole pairs after being absorbed by the p- and also n-type semiconductor layers 101 and 102. The incident light 104 generates electrons 105e and holes 105h in the region near the pn-junction 103 and also electrons 106e and holes 106h in the region far from the pn-junction 103. The photogenerated electrons 105e and 106e (and holes) (hereafter considering only electronics, i.e. minority carriers in p-type semiconductors, although the same explanation is applicable for holes, minority carriers in n-type semiconductors) diffusing toward the pn-junction 103 and entering the pn-junction 103 contribute to photovoltaic effect. The two key factors that substantially impact the conversion efficiency of this type of photovoltaic cell are photo carrier generation efficiency (PCGE) and photo carrier collection efficiency (PCCE).

The PCGE is the percentage of photons entering a cell which contribute to the generation of photo carriers, which needs to be, ideally, 100%. On the other hand, the PCCE is the percentage of photogenerated electrons 105e and 106e that reach the pn-junction 103 and contribute to the generation of photocurrent. For a monochromatic light, a PCGE of ~100% can be achieved by simply making the p-type layer 101 thicker than the n-type material; however, electrons 106e generated at the region far away from the pn-junction 103 cannot be collected efficiently due to many adverse recombination processes that prevent photogenerated carriers from diffusing into the pn-junction 103. Thus, the basic structure of current photovoltaic cells has its own limitation on increasing the conversion efficiency.

FIG. 1B shows typical monochromatic light intensity behavior 108 inside the semiconductor. As illustrated in FIG. 1B, the light intensity behavior 108 inside bulk semiconductor is exponential. The light intensity p at certain depth x can be expressed as $p(x)=P_o\exp(-\alpha x)$, where $P_o$ is the peak intensity at the surface and $\alpha$ is the absorption co-efficient of the semiconductor in which light is entering. Carriers (not shown here) generated due to light flux 112 absorbed by the pn-junction 103 is only drifted by the junction field and can be collected efficiently, whereas, carriers 106e and 106h generated due to absorption of light-flux 110 by semiconductor region 101 are diffused in all directions. Only those carriers 105e and 105h which are generated closer (a distance equal to or less than the diffusion-length of the semiconductor) to pn-junction 103 can be collected. Those carriers 106e and 106h which are generated far away (distance longer than the diffusion-length of the semiconductor) from pn-junction 103 are recombined and lost. The light flux 112 is usually lost either by leaving or being absorbed by the substrate.

Both PCGE and PCCE are largely dependent on the material and structure of the photovoltaic cells. Today's photovoltaic cells are structured in such a way that (a) wide ranges of the solar spectrum cannot be absorbed due to material limitations, and (b) PCCE is low due to its inherent structure. For example, the typical conversion efficiency of today's crystal-Si based solar cell is ~18%. Wavelengths of the solar spectrum spread from <0.1 μm to 3.5 μm, but Si can only absorb ~0.4 μm to 0.9 μm of light. ~50% of light belonging to the solar spectrum cannot be absorbed by Si due to its inherent material properties. The remaining 32% is lost due to (i) recombination of photogenerated carriers and (ii) loss of light, which is represented by 112 in FIG. 1B; these two factors are structurally dependent. If we could reduce these two factors, ~50% conversion efficiency could be achieved, even in a Si-based solar cell. If we could capture different wavelengths of light belonging to the solar spectrum by utilizing different alloyed materials, we could increase the conversion efficiency ideally to 100%. Furthermore, if the solar cell detection capability could be extended to the infrared-spectrum, then the solar cell could produce electrical energy not only during the day (while sun is present), but also at night (hereafter defined by when the sun is not out). Additionally, today's solar cell material is not highly radiation-tolerant. Specifically in space applications, photovoltaic cells should be highly radiation tolerant and have structure and material systems which can generate high-power per unit area.

For both commercial and space applications, therefore, it would be desirable to have photovoltaic cell structures where both the PCGE and PCCE can be increased simultaneously by having a photo absorption region which is thick enough to capture all the photons entering the cell and a pn-junction which is located as close to the photo absorption region as possible. It would be further desirable to have, while maintaining ideal PCGE and PCCE, materials which have photo responses at different spectrums in order to efficiently cover a wide spectrum of light that enters a photovoltaic cell. It would be further desirable to have a large junction area within a given volume of a photovoltaic cell so that generated electric power that is proportional to the junction area can be maximized. It would be further desirable to have solar cells which could generate electric power in both day and night.

BRIEF SUMMARY OF THE INVENTION

Accordingly, it is an object of the invention to provide structures of photovoltaic cells which have high power generation capability per unit area, with respect to the conventional counterparts mentioned as the prior art.

Accordingly, it is an object of this invention to reduce the recombination of carriers and increase the absorption of light, which effectively increases the photogenerated carriers.

It is an object of this invention to provide solar cell structures based on nano or micro scaled-blocks, such as rods or wires formed on the supporting substrate or formed on the electronic materials which are formed on the base substrate. The pn- or Schottky junctions are formed with nano or micro scaled-blocks, which generate built-in potential by which photogenerated electrons and holes are swept away, leading to photovoltaic effect.

According to this invention, the supporting substrate can be Si, GaAs, InP, GaN, glass, Ge, C, ZnO, BN, $Al_2O_3$, AlN, Si:Ge, CuInSe, II-VI and III-V.

It is an object of this invention to have electronic materials on which nano or micro scaled-blocks (rods, wires, or tubes) can be formed and the electronic materials can be formed on a base substrate such as Si, Ge or glass, to decrease the cost.

According to this invention, it is also an object to use the nano or micrometer scaled blocks to increase the surface area and also to increase the amplifying or concentrating the light incident onto the surface. The side of the nano or micrometer(s) scaled blocks could be any shape such as vertical or inclined at specific angle with respect to substrate surface.

It is an object of this invention to provide structures of photovoltaic cells which can capture most of the wavelengths belonging to the solar spectrum and can provide >80% conversion efficiency.

It is an object of this invention to provide structures of photovoltaic cells which can generate electric power when the sun is and is not out.

This invention offers to ideally achieve >50% conversion efficiency utilizing Si-materials and >80% conversion efficiency for other materials. The main advantage of these inventions are that today's highly matured semiconductor process technologies allow fabrication of the proposed photovoltaic cell which has much larger power generation capabilities as compared to that of conventional photovoltaic cells.

Other objects, features, and advantages of the present invention will be apparent from the accompanying drawings and from the following detailed description.

BRIEF DESCRIPTION OF THE DRAWINGS

The invention will be explained in more detail in conjunction with the appended drawings wherein.

DETAILED DESCRIPTION

Figure 2A:
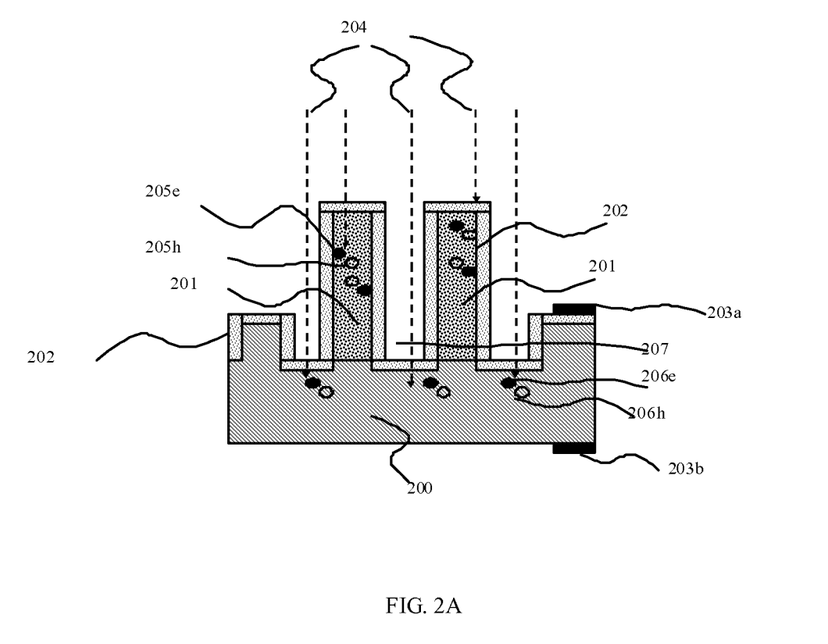
FIG. 2A is the schematic of the cross-sectional view of a photovoltaic cell structure consisting of the nanometer(s) or micrometer(s)-scaled rods, vertically arranged, in the first embodiment, in accordance with the present invention.

According to the preferred embodiment illustrated in FIG. 2A, a photovoltaic cell comprising of a plurality of nanometer(s) or micrometer(s)-scaled rods 201 is formed on the supporting substrate 200 (after having groove). The nanometer(s) or micrometer(s)-scaled rods 201 can have metallic electrical conduction, p-type or n-type semiconductor electrical conduction. The nanometer(s) or micrometer(s)-scaled rods 201 are further surrounded by an electronic material 202 having metallic electrical conduction, p-type or n-type semiconductor electrical conduction. The electronic material 202 can be a separate material or an electronic material of p or n type formed inside 201 and 200. The electronic material 202 and the supporting substrate 200 are electrically connected to electrodes 203a and 203b, respectively. The electrode 203a is intended to serve as a common electrode that connects all rods 201. The electrode 203a is provided for the electronic material 202. The electrode 203a can be transparent (not shown here) and can be formed on the electronic material 202. The interface between the nanometer scaled rods 201 and the electronic material 202 form pn- or Schottky junctions where built-in potential for both electrons and holes is generated.

Alternatively, according to this invention, the nanometer(s)-scaled rods 201 can be formed on a separate substrate (not shown here), and the electrode 203b can be formed on the substrate to have common contact for each nanometer(s)-scaled rod 201, necessary for creating a junction.

In way of an example not way of limitation, the nanometer(s)-scaled rods 201 can be made of n-type semiconductor and the electric material 202 that surrounds the nanometer(s)-scaled rods 201 can be made of p-type semiconductor. Incident light 204 enters the photovoltaic cell through either the electrode 203a or on the electronic material 202. (In FIG. 2, the incident light enters the photovoltaic cell through the electronic material 202 and not the electrode 203a). The incident light 204 travels through the nano-scaled rods 201, electronic material (n- or p-type) 202, and substrate 200. As the incident light 204 travels through the nano-scaled rods 201 and electronic material 202, numerous electrons 205e are generated in the region near the electrode 203a. Portions of light 204 which pass through the gaps 207 travel through the electronic material 202 and the supporting substrate 200, which consequentially generates electrons 206e. Some electrons 206e are generated closer to electronic material 202 and are collected, while some of which generate in the region far from the electronic material 202 and are recombined and lost. It should be pointed out that electrons are apparently generated all over the region along the thickness of the electric material 202. In addition, as the incident light 204 travels through the nanometer(s)-scaled rods 201, numerous holes 205h and 206h are generated in the rods 201 and in the substrate 200, respectively. It also should be pointed out that holes are apparently generated all over the region along the thickness of the nanometer(s)-scaled rods 201 and the substrate 200. Photogenerated electrons 205e and 206e in the electronic material 202, rods 201, and substrate 200 diffuse toward pn-junctions, created at the interface between the nanometer(s)-scaled rods 201 and the electronic material 202, and also at the interface between the electronic material 202 and substrate 200. At the pn-junctions, the electrons and the holes are swept away by built-in potential, thus photovoltaic effects set in.

Figure 2B:
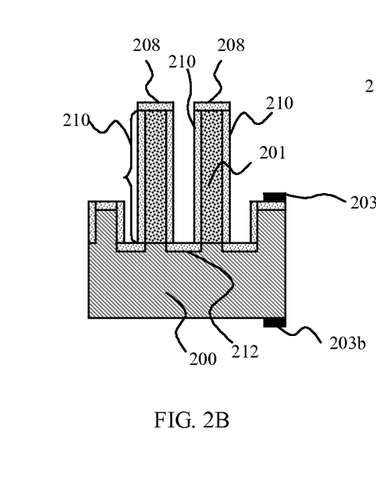
FIGS. 2B and 2C are the schematics representing the principle solar cell as shown in FIG. 2A.
Figure 2C:
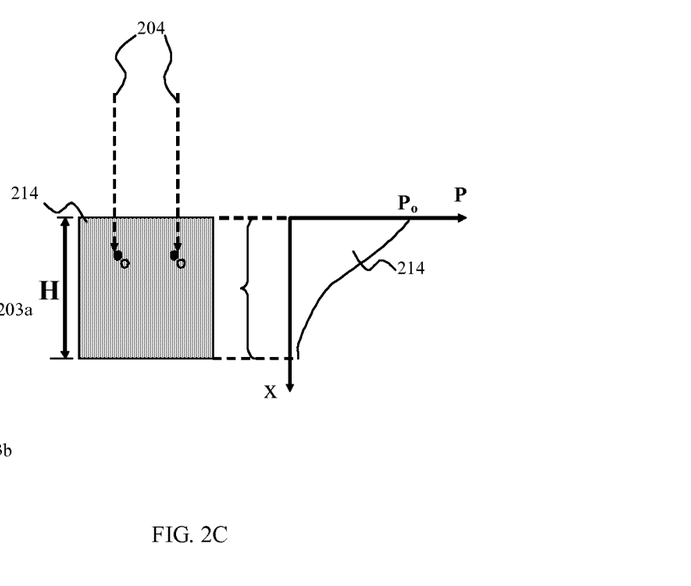

Unlike the conventional solar cell shown in FIG. 1A, the invention has pn-junctions in the regions on top 208 of the rods 201, on the side 210 of the rods 201, and in the gaps 212 in between the rods 201, as depicted in FIG. 2B. The pn-junction formed on the side 210 of the rods 201 having a penetration depth of the incident light of H (FIG. 2C), and a variation of the light intensity along the penetration depth 214 dependent on the penetration depth of the incident light H of the rods 201. The light 204 travels parallel to the direction of the pn-junction formed across side 210 of the rods and most of the light intensity along the penetration depth 214 incident on the pn-junction is absorbed and most of the photogenerated carriers can be collected. The light 204 travels perpendicular to the pn-junctions formed at the top 208 of the rods 201 and in the gaps 212 in between the rods 201. Most of the light flux incident on the top of the rods 208 can also be absorbed. The carriers generated by the light 204 incident on the top 208 of the rods can be collected without recombination (ideally). Not all carriers generated by the light 204 incident on the gaps 212 in between the rods 201 can be collected. It is apparent that utilizing the solar cell as shown in FIGS. 2A-2C can (i) reduce the recombination and (ii) absorb all photo flux, thereby increasing the conversion efficiency.

The apparent advantage of this invention over conventional photovoltaic cells is directly associated with the fact that, unlike conventional photovoltaic cells, large portions of the pn-junctions are almost parallel to the direction to which incident light 204 travels. As such, the distance all photogenerated carriers in the electronic material 202, regardless of where they are generated, have to diffuse in order to reach the pn-junctions is within the range of the distance between two nanometer(s)-scaled rods existing next to each other and that distance is independent of the location where they are generated. Furthermore, the distance all photogenerated carriers in the rods 201, regardless of where they are generated, have to diffuse to reach pn-junctions is within the range of the diameter of the nanometer(s)-scale rods 201. Only in the gaps 212 formed in between the rods 201 does light 204 travel perpendicular to the pn-junctions and, therefore, not all the carriers can be collected. According to this invention, the recombination can be made zero (ideally) and all photon flux can be absorbed (ideally), and the conversion efficiency can be made >50%, even using Si. Conventionally, as explained in the description of the prior art shown in FIG. 1, photovoltaic cells have pn-junctions that are perpendicular to the direction to which incident light travels. Therefore, the photogenerated carriers generated in the region far away from pn-junctions need to diffuse a much longer distance (diffusion-length) than photogenerated carriers generated near the pn-junctions, thus having a greater chance to recombine without contributing to photovoltaic effects. Therefore in this invention, PCCE is expected to be much higher than in conventional photovoltaic cells. In addition, it is evident that the total effective area which contributes to photovoltaic effects in this invention can be increased significantly by a few orders (>3000), considering 300 mm diameter substrate, 500 μm height rods having 50 nm diameter and 100 nm pitch.

According to this invention, in way of an example not way of limitation, the supporting substrate 200 can be n-type Si, on which n-type Si, Si—Ge, or Si-based alloyed rods 201 are formed after making the grooves on the front surface of the substrate 200. The p-type dopants can be diffused into the rods 201 and the substrate 200 regions can be opened to form the electronic material 202 of Si p-type. The metal contacts 203*a* and 203*b* can be formed on the p-type Si 202. Conformal deposition of the dielectric material (not shown) can be done for planarization, and in this case silicon oxide or a polymer can be used.

According to this invention, in way of an example not way of limitation, the supporting substrate 200 can be Ge, GaAs, InP, GaN, or ZnO on which rods 201 of same type of material can be formed.

Figure 3:
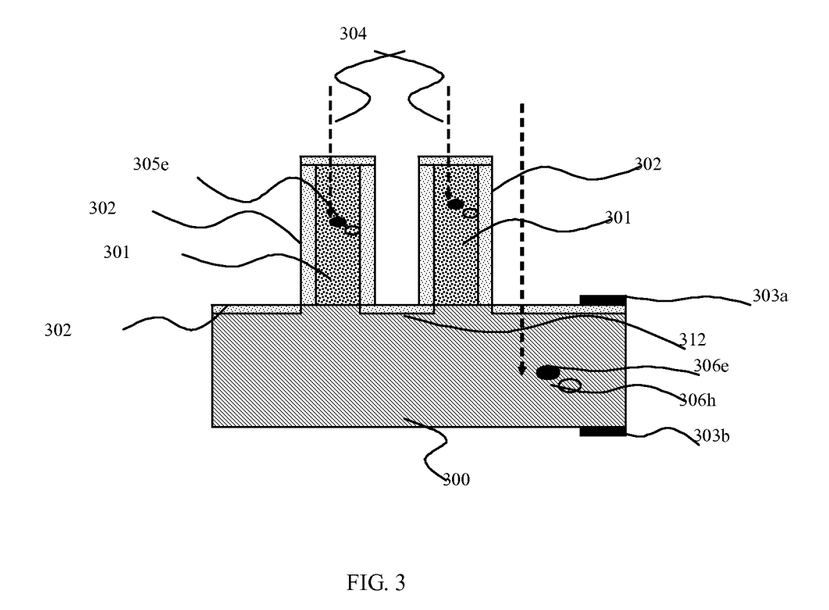
FIG. 3 is the schematic showing the cross-sectional view of a photovoltaic cell structure consisting of the nanometer(s) or micrometer(s)-scale rods, vertically arranged, in the second embodiment in accordance with the present invention.

In an alternative preferred embodiment shown in FIG. 3, a photovoltaic cell comprises a plurality of nanometer(s)-scaled rods 301 which are electrically connected to a substrate 300. The nanometer(s)-scaled rods 301 can have metallic electrical conduction, p-type or n-type semiconductor electrical conduction. The nanometer(s)-scale rods 301 are surrounded by an electronic material 302 having metallic electrical conduction, p-type or n-type semiconductor electrical conduction. The electronic material 302 can be separate material or an electronic material of p or n type formed inside or on 301 and 300. The electronic material 302 and the supporting substrate 300 are electrically connected to electrodes 303*a* and 303*b*, respectively. The electrode 303*a* is intended to serve as a common electrode that connects all rods 301. The electrode 303*a* is provided for the electronic material 302. The interface between the nanometer(s)-scale rods 301 and the electronic material 302 form pn- or Schottky junctions, thus there are pn- or Schottky junctions on both sides, inside and outside, of the nanometer(s)-scale rods 301.

Alternatively, according to this invention, the nanometer(s)-scale rods 301 can be formed on a substrate (not shown here), and the electrode 303*a* can be made on the substrate to have a common contact for each nanometer(s)-scale rod 301, necessary for creating a junction.

In way of an example not way of limitation, the nanometer(s)-scale rods 301 can be made of metal and the electronic material 302 that surrounds the nanometer(s)-scale rods 301 can be made of p-type semiconductor, thus the interface of 302/301 forms pn-junctions. Incident light 304 enters the photovoltaic cell through the electronic material 302 (front-side of the cell). As the incident light 304 travels through the electronic material 302, numerous electrons 305 and 306*e* (of electron-hole pairs) are generated. It should be pointed out that electrons (of electron-hole pairs) are apparently generated all over the region along the thickness of the nanometer(s)-scale rods 301 and also the gaps 312 in between the rods 301. Photogenerated electrons in the electronic material 302 then diffuse toward pn-junctions in the interface of 302/301. At the pn-junctions, the diffused electrons are swept away by built-in potential, thus photovoltaic effects set in.

Common advantages already described for the photovoltaic cell in FIG. 2, can be similarly achieved in this embodiment. The only difference is in forming the nano-scaled rods 301, which are formed without forming the grooves.

Figure 4A:
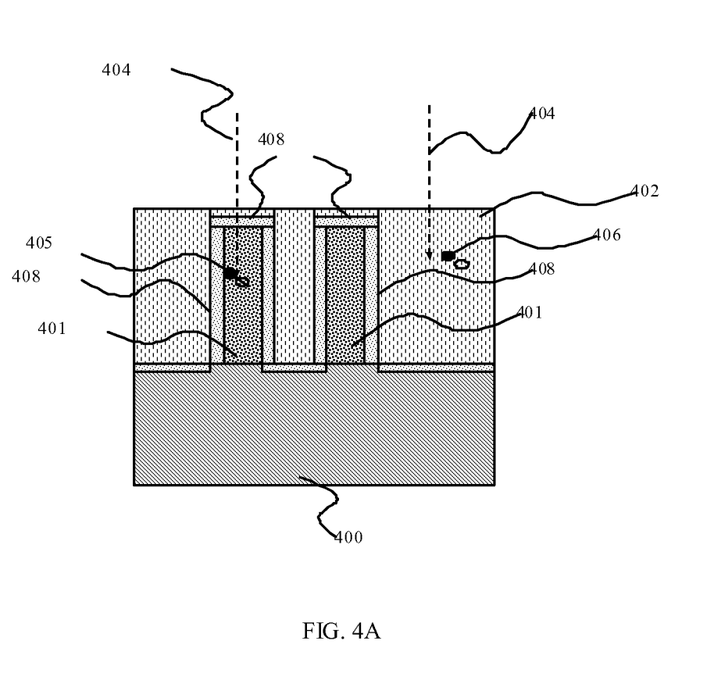
FIGS. 4A and 4B are the schematics showing the cross-sectional views of photovoltaic cell structures consisting of the nanometer(s) or micrometer(s)-scaled rods and semiconductors, bandgaps of which are related to different spectrums of the solar spectrum, in the third embodiment in accordance with the present invention.

In an alternative preferred embodiment shown in FIG. 4A, a photovoltaic cell comprises a plurality of nanometer(s)-scaled rods 401 which are electrically connected to a substrate 400. The nanometer(s)-scaled rods 401 can have metallic electrical conduction, p-type or n-type semiconductor electrical conduction. The nanometer(s)-scale rods 401 are surrounded by an electronic material 402 having metallic electrical conduction, p-type or n-type semiconductor electrical conduction. The electronic material 402 can be separate material or an electronic material of p or n type formed on 401 and 400. The electronic material 402 and the supporting substrate 400 are electrically connected to electrodes (not shown here). The interface between the nanometer(s)-scale rods 401 and the electronic material 402 form pn-junctions 408, thus creating built-in-potential for collecting photogenerated carriers.

In way of an example not way of limitation, the nanometer(s)-scale rods 401 can be made of metal and the electronic material 402 that surround the nanometer(s)-scale rods 401 can be made of p-type semiconductor, thus the interface of 402/401 forms pn-junctions 408. Incident light 404 enters the photovoltaic cell through the electronic material 402 (front-side of the cell). As the incident light 404 travels through the electronic material 402, numerous electrons 405 and 406 (of electron-hole pairs) are generated in the electronic material 402. It should be pointed out that electrons 405 and 406 (of electron-hole pairs) are apparently generated all over the region along the thickness of the electronic material 402. Photogenerated electrons in the electronic material 402 then diffuse toward the pn-junctions in the interface of 402/401. At the pn-junctions, the diffused electrons are swept away by built-in potential, thus photovoltaic effects set in.

According to this invention, in way of an example not way of limitation, the supporting substrate 400 can be n-type InP, on which n-type InP or InP-based alloyed rods 401 are formed on the front surface of the substrate 400. The p-type InGaAs layer(s) having broad spectral absorption, ranging from as low as <0.3 μm to as high as 2.5 μm, is used for the electronic material 402. The metal contacts (not shown here) can be formed on InGaAs and the substrate 400. Conformal deposition of the dielectric material (not shown) can be done for planarization, and in this case silicon oxide or a polymer can be used. Use of single or multiple layers of InGaAs helps absorb more wavelengths of light, from <0.3 μm to 2.5 μm, which range belongs to the solar spectrum.

According to this invention, in way of an example not way of limitation, the supporting substrate 400 can be GaAs, GaN, or ZnO on which rods 401 of the same type of material can be formed.

Figure 4B:
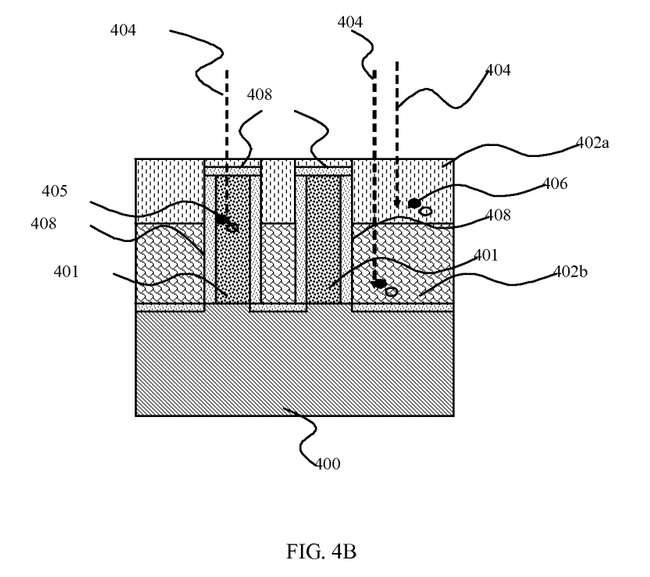

In an alternative preferred embodiment, shown in FIG. 4B, a photovoltaic cell comprises a plurality of nanometer(s)-scaled rods 401 which are electrically connected to a supporting substrate 400. The nanometer(s)-scaled rods 401 can have metallic electrical conduction, p-type or n-type semiconductor electrical conduction. The nanometer(s)-scale rods 401 are further surrounded by multi-layer electronic materials 402a and 402b (two or more), having absorption in different spectrum bands and also having metallic electrical conduction, p-type or n-type semiconductor electrical conduction. The electronic materials 402a and 402b can be separate material or an electronic materials of p or n type formed on 401 and 400. The electronic materials 402a and 402b and the supporting substrate 400 are electrically connected to electrodes (not shown here). The interfaces between the nanometer(s)-scale rods 401/402a and between 401/402b form pn-junctions 408, thus creating built-in-potential for collecting photogenerated carriers. Apparently, in addition to the common advantages already described in FIG. 2-FIG. 3 over conventional cells in FIG. 1, the additional advantage of the cell in FIG. 4B is a capability of covering a wide range of the spectrum contained in incident light 404 and converting a wide range of the spectrum to photogenerated carriers. Dozens of different layers could be stacked to catch photons at all energies, to make absorption wide enough to cover the entire solar spectrum, from lower wavelengths (as low as X-ray) to longer wavelength (e.g. long infrared). The addition of multiple junctions of different materials, which could absorb a wide solar spectrum, plus the increase in the junction area caused by using the rods 401, will help to increase the conversion efficiency close to 100% (ideally). According to this invention, dozens of materials, which could absorb wide ranges of the solar spectrum, may or may not require a lattice mismatch with the rod, wires, or tubes. Lattice matched material could further increase the power generation due to reduction of the recombination.

According to this invention, in way of an example not way of limitation, the supporting substrate 400 can be n-type InP, on which n-type InP or InP-based alloyed rods 401 are formed on the front surface of the substrate 400. The p-type InGaAs layer(s) having broad spectral absorption, ranging from as low as <0.3 µm to as high as 2.5 µm, and InSb based electronic material, are used as electronic materials 402a and 402b of p-type, respectively. The metal contacts (not shown here) can be formed on InGaAs and substrate 400. Conformal deposition of the dielectric material (not shown) can be done for planarization, and in this case silicon oxide or a polymer can be used. Use of the single or multiple layers of the InGaAs, and other antimony based electronic materials, help absorb more wavelengths of light, from <0.3 µm to 3.5 µm, which range belongs to the solar spectrum.

According to this invention, in way of an example not way of limitation, the supporting substrate 400 can be GaAs, GaN, or ZnO on which rods 401 of same type of material can be formed.

Figure 5A:
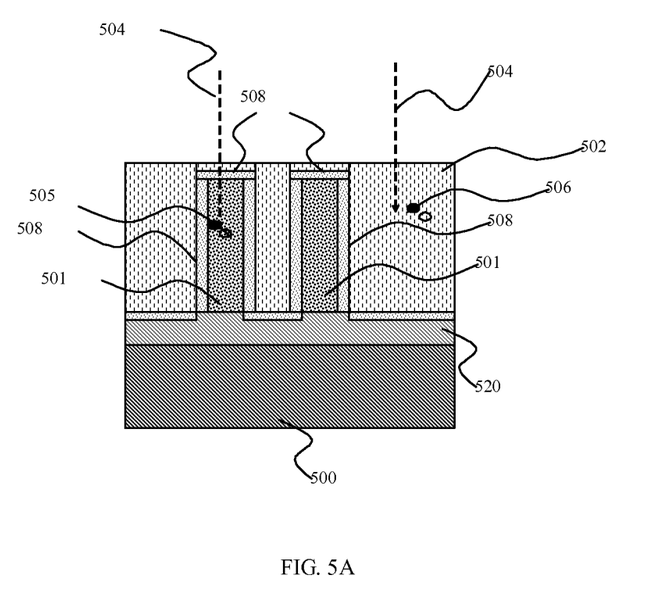
FIGS. 5A and 5B are the schematics showing the cross-sectional views of photovoltaic cell structures consisting of the nanometer(s) or micrometer(s)-scaled rods, formed on the standard low-cost substrate, in the forth embodiment in accordance with the present invention.

In an alternative preferred embodiment shown in FIG. 5A, a photovoltaic cell comprises a plurality of nanometer(s)-scaled rods 501, which are electrically connected to a substrate 500. The nanometer(s)-scaled rods 501 can have metallic electrical conduction, p-type or n-type semiconductor electrical conduction. The nanometer(s)-scale rods 501 are surrounded by an electronic material 502 having metallic electrical conduction, p-type or n-type semiconductor electrical conduction. The electronic material 502 can be a separate material or an electronic material of p or n type formed on 501 and 500. The electronic material 502 and the supporting substrate 500 are further electrically connected to electrodes (not shown here). The interface between the nanometer(s)-scale rods 501 and the electronic materials 502 form pn-junctions 508, thus creating built-in-potential for collecting photo-generated carriers. The main difference between the solar cells shown in FIGS. 4A and 5A, is that electronic material 520 is formed on the low cost supporting substrate 500 (e.g. Si or AlN).

In way of an example not way of limitation, the nanometer(s)-scale rods 501 can be made of metal and the electronic material 502 that surrounds the nanometer(s)-scale rods 501 can be made of p-type semiconductor, thus the interface of 502/501 forms pn-junctions 508. Incident light 504 enters the photovoltaic cell through the electronic material 502 (front-side of the cell). As the incident light 504 travels through the electronic material 502, numerous electrons 505 and 506 (of electron-hole pairs) are generated in electronic material 502. It should be pointed out that electrons 505 and 506 (of electron-hole pairs) are apparently generated all over the region along the thickness of the electronic material 502. Photogenerated electrons in the electronic material 502 are made of p-type semiconductor, and then diffuse toward pn-junctions 508 in the interface of 502/501. At the pn-junctions, the diffused electrons are swept away by built-in potential, thus photovoltaic effects set in.

According to this invention, in way of an example not way of limitation, the supporting substrate 500 can be n-type Si, on which lattice matched InP or InP based alloys are formed. Next, n-type InP, or InP-based alloy rods 501 are formed. The p-type InGaAs layer(s), having broad spectral absorption which ranges from as low as <0.3 µm to as high as 2.5 µm, is formed as an electronic material 502 of p-type. The metal contacts (not shown here) can be formed on InGaAs and substrate 500. Conformal deposition of the dielectric material (not shown) can be done for planarization, and in this case silicon oxide or polymer can be used. Using single or multiple layers of the InGaAs helps absorb more wavelengths of light, from <0.3 µm to 2.5 µm, of which belong to the solar spectrum.

According to this invention, in way of an example not way of limitation, the supporting substrate 500 can be Ge, GaAs, GaN, or ZnO.

Figure 5B:
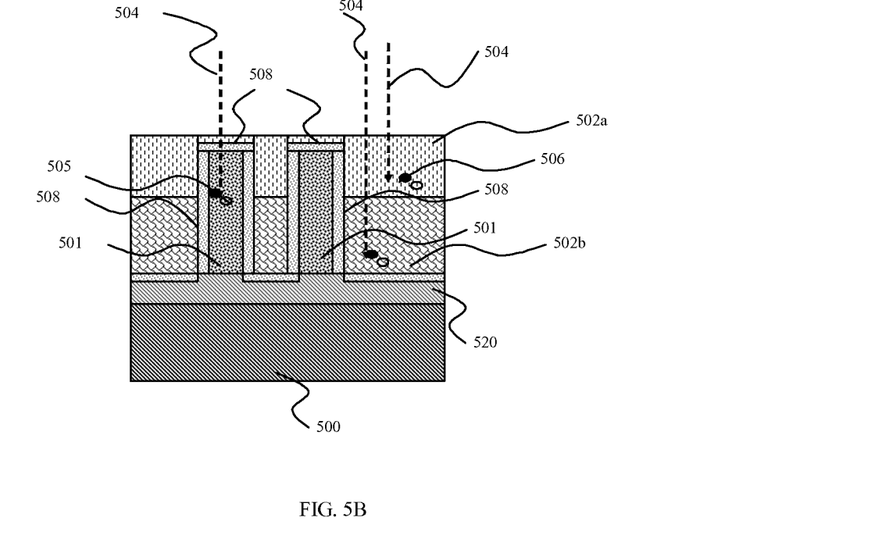
Figure 6:
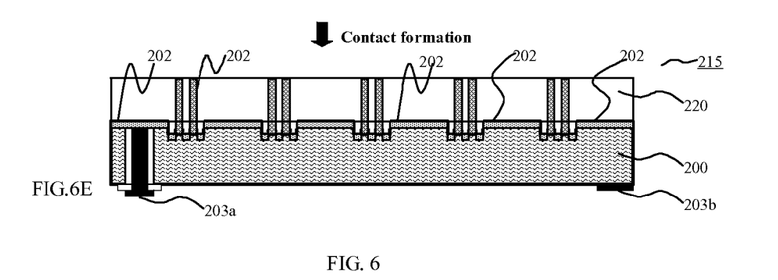
FIGS. 6A, 6B, 6C, 6D, and 6E are the schematics showing the fabrication process flow of photovoltaic cells comprising of the nanometer(s) or micrometer(s)-scaled rods, in the fifth embodiment in accordance with the present invention.
Figure 6A:
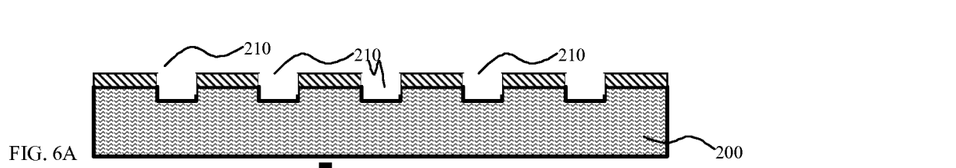
Figure 6B:
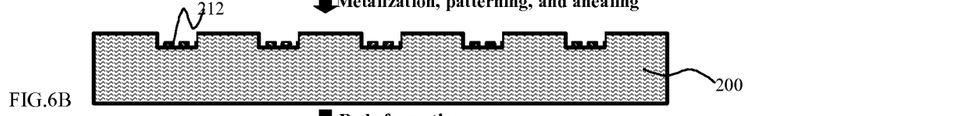
Figure 6C:
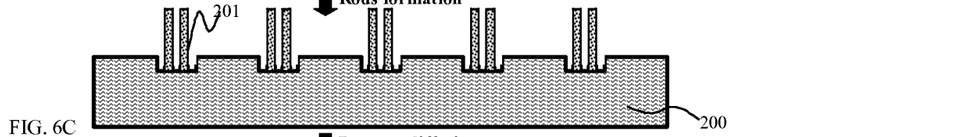
Figure 6D:
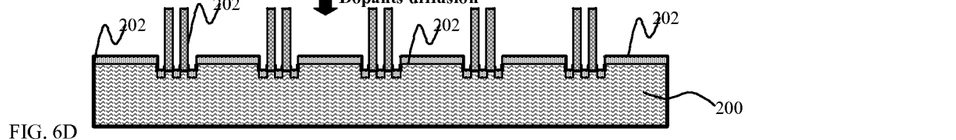
Figures 7, 7E:
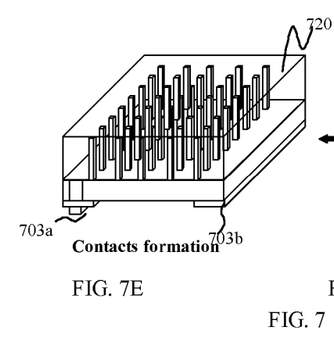
FIGS. 7A, 7B, 7C, 7D, and 7E are the schematics showing an alternative fabrication process flow of photovoltaic cells comprising of the nanometer(s) or micrometer(s)-scaled rods, in the sixth embodiment in accordance with the present invention.
Figures 7A, 7B:
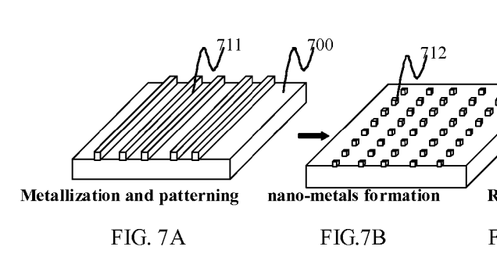
Figure 7C:
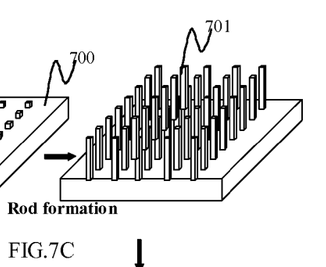
Figure 7D:
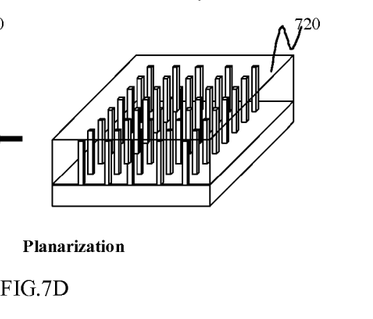
Figures 8A, 8B, 8C:
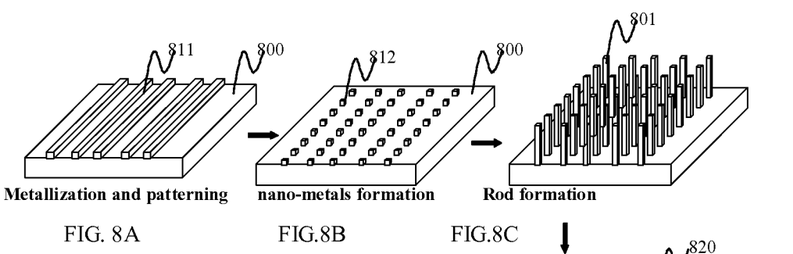
FIGS. 8A, 8B, 8C, 8D, 8E, and 8F are the schematics showing the fabrication process flow of flexible photovoltaic cells comprising of the nanometer(s) or micrometer(s)-scaled rods, in the seventh embodiment in accordance with the present invention.
Figures 8D, 8E, 8F:
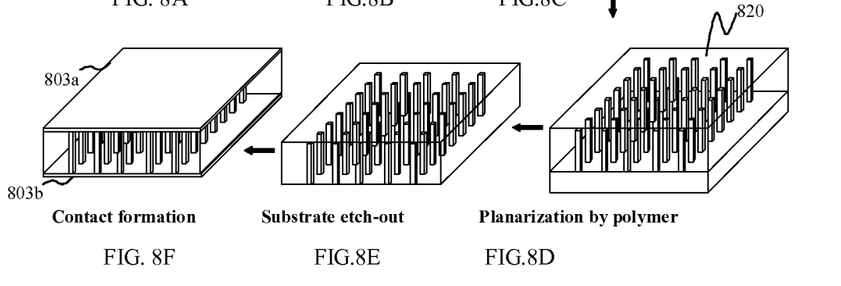

In an alternative preferred embodiment shown in FIG. 5B, a photovoltaic cell comprises a plurality of nanometer(s)-scaled rods 501, which are electrically connected to a supporting substrate 500. The nanometer(s)-scaled rods 501 can have metallic electrical conduction, p-type or n-type semiconductor electrical conduction. The nanometer(s)-scale rods 501 are surrounded by an electronic material 502, having metallic electrical conduction, p-type or n-type semiconductor electrical conduction. The electronic material 502 can be a separate material or an electronic material of p or n type formed on 501 and 500. The electronic material 502 and the supporting substrate 500 are further electrically connected to electrodes (not shown here). The interface between the nanometer(s)-scale rods 501 and the electronic material 502 form pn-junctions 508, thus creating built-in-potential for collecting photogenerated carriers. The main difference between the solar cells a shown in FIGS. 4B and 5B, is that electronic material 520 is formed on the low cost supporting substrate 500 (e.g. Si or AlN).

According to this invention, in way of an example not way of limitation, the supporting substrate 500 can be n-type Si, on which lattice matched InP or InP based alloys are formed. Next, n-type InP, or InP-based alloy rods 501 are formed. The p-type InGaAs layer(s), having broad spectral absorption which ranges from as low as <0.3 µm to as high as 2.5 µm, and InSb based electronic material are formed as electronic materials 502a and 502b of p-type, respectively. The metal contacts (not shown here) can be formed on InGaAs and substrate 500. Conformal deposition of the dielectric material (not shown) can be done for planarization, and in this case silicon oxide or polymer can be used. Using single or multiple layers of the InGaAs and other antimony based electronic material, helps absorb more wavelengths of light, from <0.3 µm to 3.5 µm, of which belong to the solar spectrum.

According to this invention, in way of an example not way of limitation, the supporting substrate 500 can be Ge, GaAs, GaN, or ZnO.

FIGS. 6A, 6B, 6C, 6D, and 6E are the schematics showing the fabrication process of the photovoltaic cell according to this invention, wherein the same numerals in FIGS. 6A-E represent the same parts in FIG. 2, so that similar explanations are omitted. According to this invention, supporting substrate 200 can be crystal-Si, Ge, GaAs, or InP. After standard photolithography and wet-etching, grooves 210 are formed onto the front surface of the substrate 200. A thin metal layer (not shown here) is formed, which is followed by the patterning and etching to form several nano-scaled lines inside the grooves 210. High temperature annealing can be used to form nano-sized metals 212 which can be used as a catalyst for forming the rods 201. Using conventional chemical vapor deposition techniques, the rods 201 are formed. It is noted here that using grooves 210 helps control the size distribution and density of the rods 201. Using a diffusion process, dopants (e.g. p-type) are diffused to form the pn-junction. For making the planarization, conformal deposition of the silicon-oxide or polymer can be used (not shown here). The final stages make the planarization, using insulator layer 220, and contacts 203a and 203b. Both contacts 203a and 203b can be taken from the back side of the substrate 200 after planarization for completing the solar cell 215, as shown in FIG. 6F.

FIGS. 7A, 7B, 7C, 7D, and 7E are the schematics showing the fabrication process of the solar cell according to this invention. Here, as in FIGS. 6A-F, the metal lines 711 patterns are created for making the nano-metals 712. The only difference with what was explained in FIGS. 6A-F, is that no grooves are made on the substrate 700. The explanation of the fabrication process and the structure of the cells is previously explained in FIGS. 2-6, so that repeated explanation is omitted here.

FIGS. 8A, 8B, 8C, 8D, 8E, and 8F are the schematics showing the fabrication process of the flexible solar cell according to this invention. Here, as in FIGS. 6A-F and FIGS. 7A-E, the metal lines 811 patterns are created for making the nano-metals 812. The only difference with what was explained in FIGS. 7A-E, is that substrate 800 is etched out after coating with conducting polymer. The explanation hereafter is already explained in the discussion of FIGS. 7A-E, so that repeated explanation is omitted here.

Figure 9A:
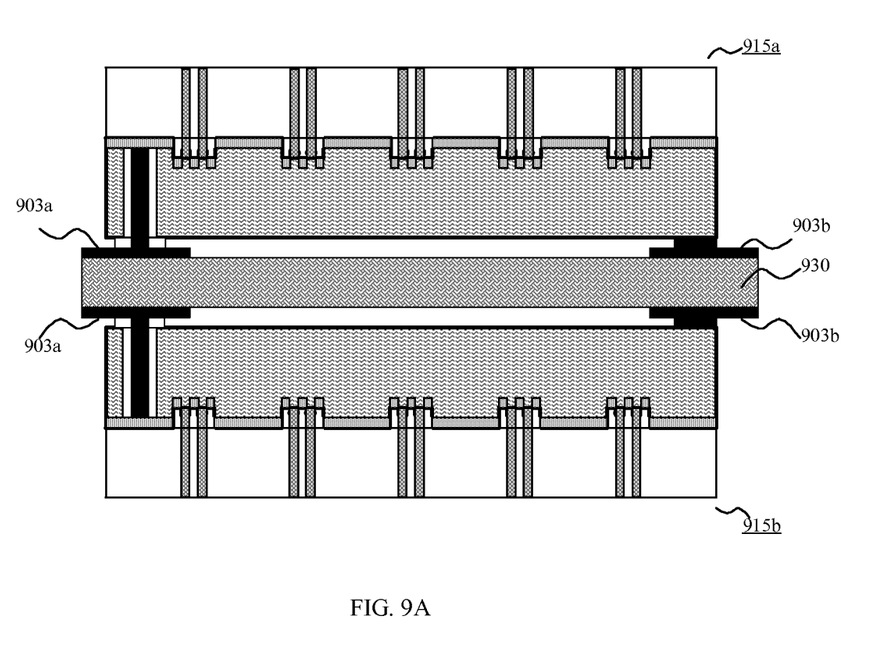
FIGS. 9A and 9B are the schematics representing the enlarged cross-sectional view of the day and night solar cell in according to the invention and panel of said solar cells, respectively.
Figure 9B:
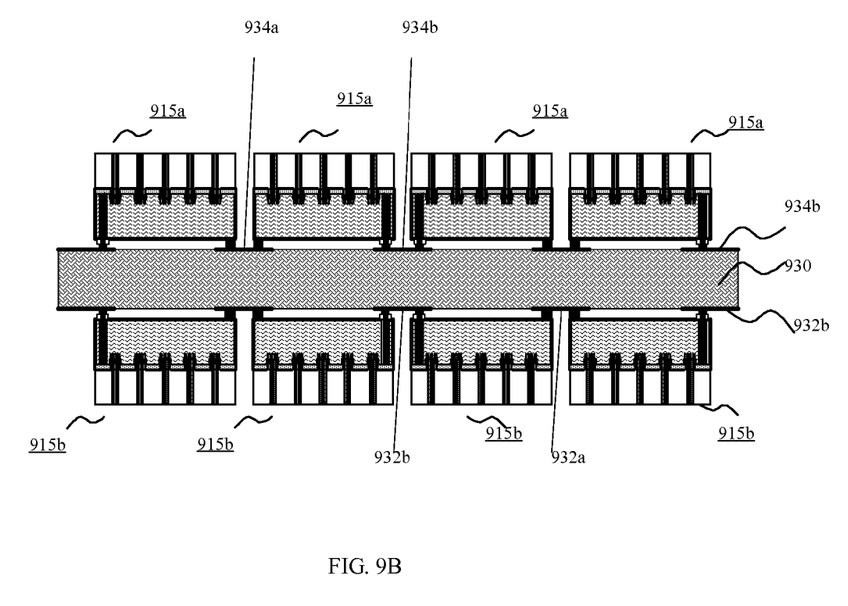

FIGS. 9A and 9B are the schematics representing the enlarged cross-sectional view and large panel of the day and night photovoltaic cell, respectively and in accordance with the invention. The day and night solar cell can be a single or hybrid cell discretely integrated. In the single cell case (not shown here), the cell can be fabricated to capture a wide range of the spectrum, not only the solar spectrum but also the thermal spectrum, which is especially necessary when the sun is not out. In the hybrid case, as shown in FIG. 9A, the solar cell 915a and the solar cell 915b are designed for separate day and night purposes and they are discretely integrated using the common panel 930, which helps to connect other solar cells together. The solar cell 915a can be designed (as mentioned above in the preferred embodiments) in such a way that most of the solar spectrum is captured. For example, in the case of c-Si, the cell can capture all visible and near infrared (IR) spectrums of light. On the other hand, the solar cell 915b can be designed (as mentioned above in the preferred embodiments) in such a way that most of the infrared spectrum and thermal spectrum can be captured. HgCdTe based material can be used for capturing a wide IR spectrum. HgCdTe on Si can also be used for obtaining a low cost objective. InGaAs and GaSb based materials can also be used as an absorption material for capturing visible to shortwave-infrared spectrums and shortwave-infrared to longwave-infrared spectrum respectively.

A series of solar cells 915a and 915b can be connected on each side of the panel as shown in FIG. 9B, in such as way that the common connections 934a and 934b for solar cell 915a are connected in series or in parallel with others, and similarly for connections 932a and 932b for a series of solar cells 915b. The fabrication process and structure of solar cells 915a and 915b are previously explained in the discussion of FIGS. 2-6, so that repeated explanation is omitted here. The common panel 930 carries two types of solar cells and their connections to outside world for energy generation and distribution to the outside.

According to this invention, the rods, or wires, could be GaN materials (n or p type) and the dozens of materials could be $In_{1-x}Ga_xN$ (p or n type, opposite to GaN rods). With increasing of the Ga content, the band-gap of InGaN can be increased to ~3.4 eV, which is the same as that of the GaN. By increasing the In content in InGaN, the band gap can be reduced to ~0.65 eV. Photons with less energy than the band gap will slip right through. For example, red light photons are not absorbed by high-band-gap semiconductors. However, photons with energy higher than the band gap are absorbed—for example, blue light photons in a low-band-gap semiconductor will be absorbed—their excess energy is wasted as heat.

According to this invention, alternatively the rods, or wires, could be III-V based materials (n or p type). For example InP and the dozens of materials could be III-V based material, for example $In_{1-x}Ga_xAs$ (p or n type, opposite to InP rods). In this case, by adjusting the In contents, the band gap can be tuned and thereby a wide spectrum of the solar energy can be absorbed.

According to this invention, alternatively the rods, or wires, could be II-V based materials (n or p type). For example CdTe and the dozens of materials could be II-VI based material, for example CdZnS (p or n type, opposite to CdTe rods). In this case, by adjusting the Zn contents, the band gap can be tuned and thereby a wide spectrum of the solar energy can be absorbed.

According to this invention, alternatively the rods, or wires, could be Si or amorphous Silicon materials (n or p type), and the dozens of materials could be Si: Ge alloys (p or n type, opposite to Si rods). In this case, by adjusting the Ge contents, the band gap can be tuned and thereby a wide spectrum of the solar energy can be absorbed.

According to this invention, alternatively the rods, or wires, could be Si, InP, or CdTe (n or p type), and the dozens of materials could be different material which could create the junction with the rods (wires or tubes). Each type of material has a specific band gap for absorbing the specific range of the solar spectrum. In this way a wide range of the solar spectrum can be absorbed and by increasing the junction area (due to use of the rods, wires, or tubes), the electrical power generation could be increased tremendously: 50 times and beyond.

According to this invention, the nanometer(s)-scale wires, rods or tubes, mentioned in the preferred embodiments, can be any kind of electronic materials including semiconductors, insulators or metals.

According to this invention, the nanometer sized rods, wires, or tubes, can be made from semiconductors such as Si, Ge, or compound semiconductors from III-V or II-VI groups.

As an example for rods, wire, or tubes, a InP, GaAs, or GaN III-V compound semiconductor can be used and they can be made using standard growth processes, for example, MOCVD, MBE, or standard epitaxial growth. According to this invention, the self-assembled process can also be used to make wires, rods, or tubes and their related pn-junction to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

According to this invention, the nanometer sized rods, wires or tubes, based on II-VI compound semiconductors can also be used. As an example CdTe, CdS, Cdse, ZnS, or ZnSe can be used, and they can be made using standard growth processes, for example, sputtering, evaporation, MOCVD, MBE, or standard epitaxial growth. According to this invention, the self-assembled process can also be used to make wires, rods, or tubes and their related pn-junctions to increase the junction area. These rods, wires, or tubes can be grown on the semiconductors (under same group or others), polymers, or insulators. Alternatively, according to this invention, these rods, wires, or tubes can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

According to this invention, the rods, wire, or tubes, mentioned earlier to make the photovoltaic cell, can be micro or nano scaled and their sides could be vertical or inclined (in shape) at an angle (e.g α) with respect to the surface of substrate. Alternatively, the side could be nay shape convenient to manufacturing and increase the surface area. The advantage of using the inclined side is to concentrate the incident light falling onto the side and the gap in between the rods, wires, or tubes.

According to this invention, the nanometer sized rods, wires, or tubes can be made from carbon type materials (semiconductors, insulators, or metal like performances) such as carbon nano-tubes, which could be single or multiple layered. They can be made using standard growth processes, for example, MOCVD, MBE, or standard epitaxial growth. According to this invention, the self-assembled process can also be used to make wires, rods, or tubes and their related pn-junctions to increase the junction area. These tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide, etc.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching here is set forth.

The present invention is expected to of practical use as novel photo-voltaic cells with higher power generation capability (25 times and beyond), as compared to the conventional cells. The proposed invention can be used for fabricating wide solar panels for both commercial and space applications.

What is claimed is:

1. A photovoltaic device comprising:
  a first photovoltaic cell, wherein said first photovoltaic cell comprises:
    a first substrate having a front surface;
    a first two-dimensional array of substantially vertical rods, wires or tubes constructed from electrical conductive material of first type,
      wherein said vertical rods, wires, or tubes of first two-dimensional array are disposed on the front surface of said first substrate, such that the adjacent rods, wires, or tubes of first two-dimensional array have gaps in between, wherein the vertical rods, wires, or tubes of first two-dimensional array are micrometer-scale or nanometer-scale;
    a layer of electrical conductive material of second type, disposed over the vertical rods, wires, or tubes of first two-dimensional, array and on the first substrate over the gaps between the vertical rods, wires, or tubes of first two-dimensional array, such that said layer of electrical conductive material of second type surrounds the vertical rods, wires, or tubes of first two-dimensional array;
    a first electrode electrically connected to said layer of electrically conductive material of second type; and
    a second electrode electrically connected to said first substrate such that the vertical rods, wires, or tubes of first two-dimensional array are connected to the second electrode having opposite polarity relative to said layer of electrically conductive material of second type, and wherein said layer of electrically conductive material of second type forms first charge separating junctions at respective interfaces with the vertical rods, wires, or tubes of first two-dimensional array and the first substrate;
  a second photovoltaic cell, wherein said second photovoltaic cell comprises:
    a second substrate having a front surface;
    a second two-dimensional array of substantially vertical rods, wires, or tubes constructed from electrical conductive material of third type,
      wherein said vertical rods, wires, or tubes of second two-dimensional array are disposed on the front surface of said second substrate such that the adjacent rods, wires, or tubes of second two-dimensional array have gaps in between,
      wherein the vertical rods, wires, or tubes of second two-dimensional array are micrometer-scale or nanometer-scale;
    a layer of electrical conductive material of foul disposed over the vertical rods, wires, or tubes of second two-dimensional and on the second substrate over the gaps between the vertical rods, wires, or tubes of second two-dimensional array such that said layer of electrical conductive material of type surrounds the vertical rods, wires, or tubes of second two-dimensional array;
a third electrode electrically connected to said layer of electrical conductive material of fourth type; and
a fourth electrode electrically connected to said second substrate such that the vertical rods, wires, or tubes of second two-dimensional array are connected to the fourth electrode having opposite polarity relative to said layer of electrical conductive material of fourth type, and wherein said layer of electrical conductive material of fourth type forms second charge separating junctions at respective interfaces with the vertical rods, wires, or tubes of second two-dimensional array and the second substrate; and
a common carrier panel having a top surface and a bottom surface,
wherein said first photovoltaic cell is connected to the top surface of said commute carrier panel, and
wherein said second photovoltaic cell is connected to the bottom surface of said common carrier panel.

2. The photovoltaic device of claim 1, wherein the front surface of each of the said first and second substrates has as two-dimensional array of grooves, and said rods, wires, or tubes of the first array and second array are respectively vertically arranged in said grooves of the first and second substrates.

3. The photovoltaic device of claim 1, wherein said vertical rods, wires, or tubes of each of the first and second two-dimensional arrays are substantially cylindrical.

4. The photovoltaic device of claim 1, wherein said first and second charge separating junctions are pn-junctions or Schottky junctions.

5. The photovoltaic device of claim 1, wherein said common carrier panel is dielectric, insulator, or polymer.

6. The photovoltaic device of claim 1, wherein said first photovoltaic cell is formed from materials suitable for absorbing radiation from the visible spectrum, and wherein said second photovoltaic cell is formed from materials suitable for absorbing infrared radiation.

7. The photovoltaic device of claim 1, further comprising:
a plurality of first photovoltaic cells; and
a plurality of second photovoltaic cells,
wherein said plurality of first photovoltaic cells are connected to each other in series, and wherein said plurality of second photovoltaic cells are connected to each other in series.

8. The photovoltaic device of claim 1, wherein said vertical rods, wires, or tubes of each of the first and second two-dimensional arrays are substantially cylindrical shaped, having heights ranges from 1 to about 100 microns, diameters ranging from 10 to 1000 nanometers, and a pitch ranges from 10 to about 5000 nanometers.

9. The photovoltaic device of claim 1, wherein said layer of electrically conductive material of second type comprises more than one electrically conductive material.

10. The photovoltaic device of claim 1, wherein different predetermined sections of each of said first and second photovoltaic cells at t constructed from different materials having different bandgaps, so as to collectively capture radiation having different wavelengths.

11. A photovoltaic device comprising:
at first photovoltaic cell, wherein said first photovoltaic cell comprises:
a first substrate having a front surface;
a, first two-dimensional array of substantially vertical rods, wires, or tubes constructed from electrical conductive material of first type,
wherein said vertical rods, wires, or tubes are disposed on the front surface of said first substrate, such that the adjacent rods, wires, or tubes have gaps in between,
wherein the vertical rods, wires, or tubes are micrometer-scale or nanometer-scale;
a layer of electrical conductive material of second type, disposed Over the vertical rods, wires, or tubes and on the first substrate over the gaps between the vertical rods, wires, or tubes, such that said layer of electrical conductive material of second type surrounds the vertical rods, wires, or tubes;
a first electrode electrically connected to said layer of electrically conductive material of second type; and
a second electrode electrically connected to said first substrate such that the vertical rods, wires, or tubes are connected to the second electrode having opposite polarity relative to said layer of electrically conductive material of second type and wherein said layer of electrically conductive material of second type forms first charge separating junctions at respective interfaces with the vertical rods, wires, or tubes and the first substrate:
a second photovoltaic cell, wherein said second photovoltaic cell comprises:
a second substrate having a front surface;
a layer of electrical conductive material of third type,
a layer of electrical conductive material of fourth type, opposite polarity to said layer of electrical conductive material of third type, disposed over the layer of electrical conductive material of third type, such that a second charge separating junction is formed at the interface between said layers of electrical conductive materials of third and fourth types;
a third electrode electrically connected to said layer of electrical conductive material of fourth type; and
a fourth electrode electrically connected to said second substrate; and
a common carrier panel having a top surface and a bottom surface,
wherein said first photovoltaic cell is connected to the top surface of said common carrier panel, and
wherein said second photovoltaic cell is connected to the bottom surface of said common carrier panel.

12. A photovoltaic device comprising:
a first photovoltaic cell, wherein said first photovoltaic cell comprises:
a first substrate having a front surface;
a first two-dimensional array of substantially vertical rods, wires, or tubes constructed from electrical conductive material of first type,
wherein said vertical rods, wires, or tubes of first two-dimensional array are disposed on the front surface of said first substrate, such that the adjacent rods, wires, or tubes of first two-dimensional array have gaps in between, wherein the vertical rods, wires, or tubes of first two-dimensional array are micrometer-scale or nanometer-scale;
a layer of electrical conductive material of second type, disposed over the vertical rods, wires, or tubes of first two-dimensional array and on the first substrate over the gaps between the vertical rods, wires, or tubes of first two-dimensional array, such that said layer of electrical conductive material of second type surrounds the vertical rods, wires, or tubes of first two-dimensional array;

a first electrode electrically connected to said layer of electrical conductive material of second type; and a second electrode electrically connected to said first substrate such that the vertical rods, wires, or tubes of first two-dimensional array are connected to the second electrode having opposite polarity relative to said layer of electrical conductive material of second type, and wherein said layer of electrical conductive material of second type forms first charge separating junctions at respective interfaces with e vertical rods, wires, or tubes of first two-dimensional array;

a second photovoltaic cell, wherein said second photovoltaic cell comprises:

a second substrate having a front surface;

a second two-dimensional array of substantially vertical rods, wires, or tubes constructed from electrical conductive material of third type, wherein said vertical rods, wires, or tubes of second two-dimensional array are disposed on the front surface of said second substrate such that the adjacent rods, wires, or tubes of second two-dimensional array have gaps in between, wherein the vertical rods, wires, or tubes of second two-dimensional array are micrometer-scale or nanometer-scale;

a layer of electrical conductive material of fourth type, disposed over the vertical rods, wires, or tubes of second two-dimensional array and on the second substrate over the gaps between the vertical rods, wires, or tubes of second two-dimensional array such that said layer of electrical conductive material of fourth type surrounds the vertical rods, wires, or tubes of second two-dimensional array;

a third electrode electrically connected to said layer of electrical conductive material of fourth type; and a fourth electrode electrically connected to said second substrate such that the vertical rods, wires, or tubes of second two-dimensional array are connected to the fourth electrode having opposite polarity relative to said layer of electrical conductive material of fourth type, and wherein said layer of electrical conductive material of fourth type forms second charge separating junctions at respective interfaces with the vertical rods, wires, or tubes of second two-dimensional array; and a common carrier panel haying a top surface and as bottom surface, wherein said first photovoltaic cell is connected, to the top surface of said common carrier panel, and wherein said second photovoltaic cell is connected to the bottom surface of said common earner panel.

13. The photovoltaic device of claim 1, wherein said first or second photovoltaic cell is formed through a method comprising:

forming a thin layer of at least one metal or metal alloy on the front surface of said first or second substrate;

forming plurality of metal particles from the said metal or metal alloy layer using high temperature treatment;

growing the vertical rods, wires, or tubes of said first or second two-dimensional array by utilizing said particles as catalyst;

forming the layer of electrical conductive material of second or fourth type either by doping said vertical rods, wires, or tubes of first or second two-dimensional array by a diffusion process, or by depositing a layer of electronic material of second or fourth type on said vertical rods, wires, or tubes of first or second two-dimensional array to form said first or second charge separating junctions;

forming as transparent layer of first metallic conductive material as said first or third electrode over said layer of electrical conductive material of second or fourth type; and forming a second metallic conductive material for said second or fourth electrode on said substrate.

14. The photovoltaic device of claim 1, wherein said layers of electrical conductive material of second and fourth types are respectively conformally disposed over the vertical rods, wires, or tubes of the first and second two-dimensional arrays, and wherein the first and second photovoltaic cells further comprise a passivation layer, thereby forming a flat surface.

15. The photovoltaic device of claim 1 further comprising at least one layer of electrical conductive material, of fifth type disposed on said layer of electrical conductive material of second and/or fourth type, wherein said layer of electrical conductive material of fifth type has opposite polarity from the layer of electrical conductive material on which said layer of electrical conductive material of fifth type is disposed, thereby forming more than one charge separating junctions.

16. The photovoltaic device of claim 1, wherein said first and second substrates are thinned, and further comprising:

a first support base connected to said first substrate; and a second support base connected to said first substrate.

17. The photovoltaic device of claim 1, wherein said layers of electrical conductive material of second and fourth types are disposed such that they respectively surround and embed said vertical rods, wires, or tubes of the first and second two-dimensional arrays and on the first and second substrates and form a level surface.

18. The photovoltaic device of claim 12, wherein said first and second substrates are selected from a group consisting of: semiconductor, polymer, and ceramic.

19. The photovoltaic device of claim 7, wherein at least some of said first and second photovoltaic cells are constructed from different materials having different bandgaps, so as to collectively capture radiation having different wavelengths.

20. The photovoltaic device of claim 11, further comprising a plurality of the first photovoltaic cells, wherein said plurality of the first photovoltaic cells are connected to each other in series or in parallel.

* * * * *